(12) United States Patent
Moench et al.

(10) Patent No.: US 6,670,843 B1
(45) Date of Patent: Dec. 30, 2003

(54) METHOD AND APPARATUS FOR SENSING A PROGRAMMING STATE OF FUSES

(75) Inventors: Jerry D. Moench, Austin, TX (US); Gregory A. Constant, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/209,141

(22) Filed: Jul. 31, 2002

(51) Int. Cl.[7] ............................................... H01H 85/00
(52) U.S. Cl. ...................................................... 327/525
(58) Field of Search ................................. 327/525, 526; 365/225.7

(56) References Cited

U.S. PATENT DOCUMENTS 6,147,546 A * 11/2000 Verwegen .................. 327/525
6,400,208 B1 * 6/2002 Lesher et al. ............... 327/525

* cited by examiner

*Primary Examiner*—Terry D. Cunningham
*Assistant Examiner*—Quan Tra
(74) *Attorney, Agent, or Firm*—Zagorin, O'Brien & Graham, LLP

(57) ABSTRACT

A fuse cell circuit includes a first fuse and a first fuse sense circuit that senses a programming state of the first fuse and supplies an indication thereof. A sense control circuit includes a plurality of reference fuses and a second fuse sense circuit coupled to the reference fuses. The sense control circuit supplies a sense control signal to the fuse cell circuits to cause the fuse cell circuits to sense the programming state of the first fuse when the sense control signal is asserted. The sense control signal is asserted for a time period determined , at least in part, by a resistance value of the reference fuses. The integrated circuit may also include a resistance varying circuit coupled to vary a resistance value of a current path of the reference fuses according to one or more control signals.

30 Claims, 4 Drawing Sheets

METHOD AND APPARATUS FOR SENSING A PROGRAMMING STATE OF FUSES

BACKGROUND

1. Field of the Invention

This invention relates to integrated circuits and more particularly utilization of fuses therein.

2. Description of the Related Art

Polysilicon agglomeration fuses are often used in microprocessors to implement small PROM arrays which are used to store various configuration information. Typically, the small PROM arrays are programmed as part of the testing process during manufacturing. A polysilicon fuse is simply a short piece of polysilicon that is used as a fuse element. To "program" the fuse element a large current is passed through the fuse element, which then heats up and changes the resistance of the fuse element permanently. The resistance of a fuse is measured using a "sensing" circuit to determine if the fuse has been programmed or not. A programmed fuse will be read as one logic sense (e.g., a "1") while an unprogrammed fuse will be read as the opposite sense (e.g. a "0"). In this way information needed to configure the internal operation of a processor can be programmed into the fuse-based PROM array and stored there permanently.

Since "reading" a fuse element involves measuring the resistance of a piece of polysilicon, the circuitry employed to read the fuse elements usually involves relatively complex and, sometimes, area intensive analog circuitry such as sense amplifiers, current references, voltage references, current mirrors and the like.

Using such analog circuitry makes testing the fuse sensing circuits difficult without adding often complex additional support circuitry. It is desirable to simplify the circuitry for sensing and testing as much as possible in order to streamline the design process and reduce the silicon area needed for the fuse sensing circuitry.

SUMMARY

Accordingly, the invention provides a circuit for sensing fuses that is extremely simple, can be implemented in a relatively small area and lends itself well to testability.

In one embodiment, an integrated circuit includes at least one fuse cell circuit, which includes a first fuse and a first fuse sense circuit coupled to sense a programming state of the first fuse and supply an indication thereof. A sense control circuit includes a plurality of reference fuses and a second fuse sense circuit coupled to the reference fuses. The sense control circuit supplies a sense control signal to the fuse cell circuit to cause the fuse cell circuit to sense the programming state of the first fuse when the sense control signal is asserted. The sense control signal is asserted for a time period determined, at least in part, by a resistance value of the reference fuses. The integrated circuit may also include a resistance varying circuit coupled to vary a resistance value of the reference fuses according to one or more control signals.

In another embodiment a method is provided for determining a programming state of one or more fuses. The method includes receiving a read fuse request in a sense control circuit and generating an asserted sense control signal in response to the read fuse request. A current is caused to flow through a reference resistance in response to the asserted sense control signal. The sense control signal then deasserts according to a voltage level present at one end of the reference resistance when the current flows through the reference resistance. The method may further include supplying the sense control signal to at least one fuse cell including a fuse and a sensing circuit, to cause a sense current to flow the fuse. A voltage generated at a first end of the fuse is sensed to determine the programming state of the fuse. The method may further include varying the reference resistance.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1:
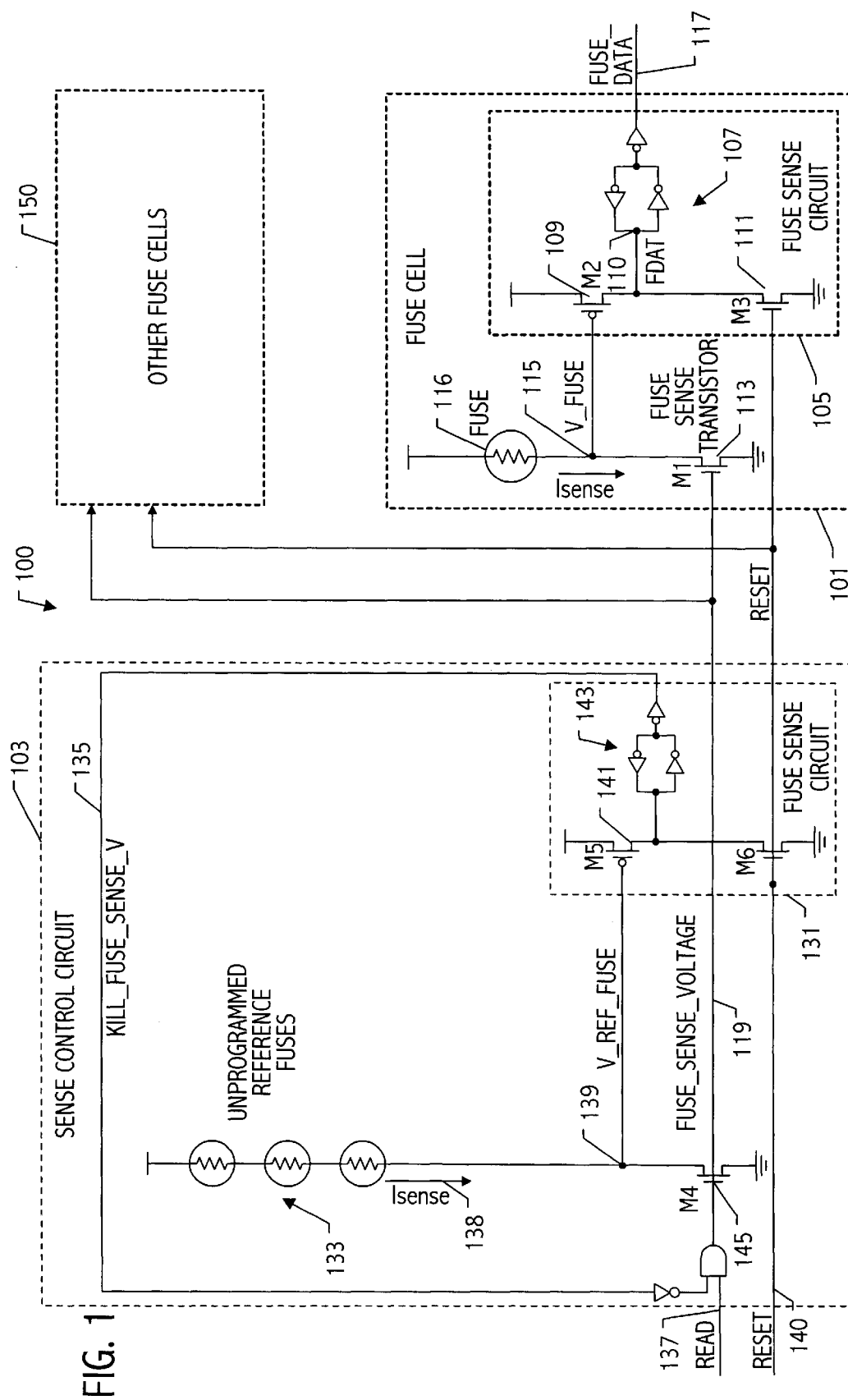
FIG. 1 illustrates a sense control circuit and a fuse cell according to an embodiment of the invention.

FIG. 1 illustrates a circuit 100 according to an embodiment of the invention. The circuit includes a fuse cell 101 and a sense control circuit 103. The fuse cell 101 includes a fuse sense circuit 105 that includes a simple cross-coupled inverter storage cell 107 along with a pull-up transistor 109 (M2) and pull-down transistor 111 (M3). The pull-down transistor 111 (M3) is used to reset the fuse storage cell at power-up when a RESET signal 140 is asserted. The pull-up transistor 109 (M2) along with the fuse sense transistor 113 (M1) are used to essentially measure the resistance of the fuse to determine the state of the fuse, i.e., whether the fuse is programmed. A voltage is applied to the gate of the sense transistor 113 (M1), thereby providing a path to ground through sense transistor 113, which causes current to flow through the fuse element 116. If the resistance of the fuse element 113 is high enough (if the fuse is programmed) the voltage at node 115 (V_FUSE) will be low enough to turn on the P-channel pull-up transistor 109 (M2), thereby supplying a logical one to node 110, which will cause the fuse storage cell 107 to flip (assuming it was at zero) and the signal FUSE_DATA on node 117 to transition from 0 to 1. The voltage on node 119 (FUSE_SENSE_VOLTAGE), which is applied to the gate of the sense transistor 113 controls the current flowing through the fuse. That voltage is generated by the sense control circuit 103 as described below.

Still referring to FIG. 1, the sense control circuit 103 includes a fuse sense circuit 131 (which is similar or identical to all other fuse sense circuits), a number of unprogrammed reference fuses 133 (three are shown in FIG. 1) and several logic gates whose function is explained below. The function of control circuit 103 is to generate the FUSE_SENSE_VOLTAGE signal on node 119, which is applied to the gate of the fuse sense transistor 113 (M1) in all of the fuse cells. Note that FUSE_SENSE_VOLTAGE signal is not full-rail. Also note that although FIG. 1 shows one control circuit and one fuse cell in detail, there will typically be one control circuit 103 shared with an array of many fuse cells as indicated by the fuse cells 150.

Figure 2:
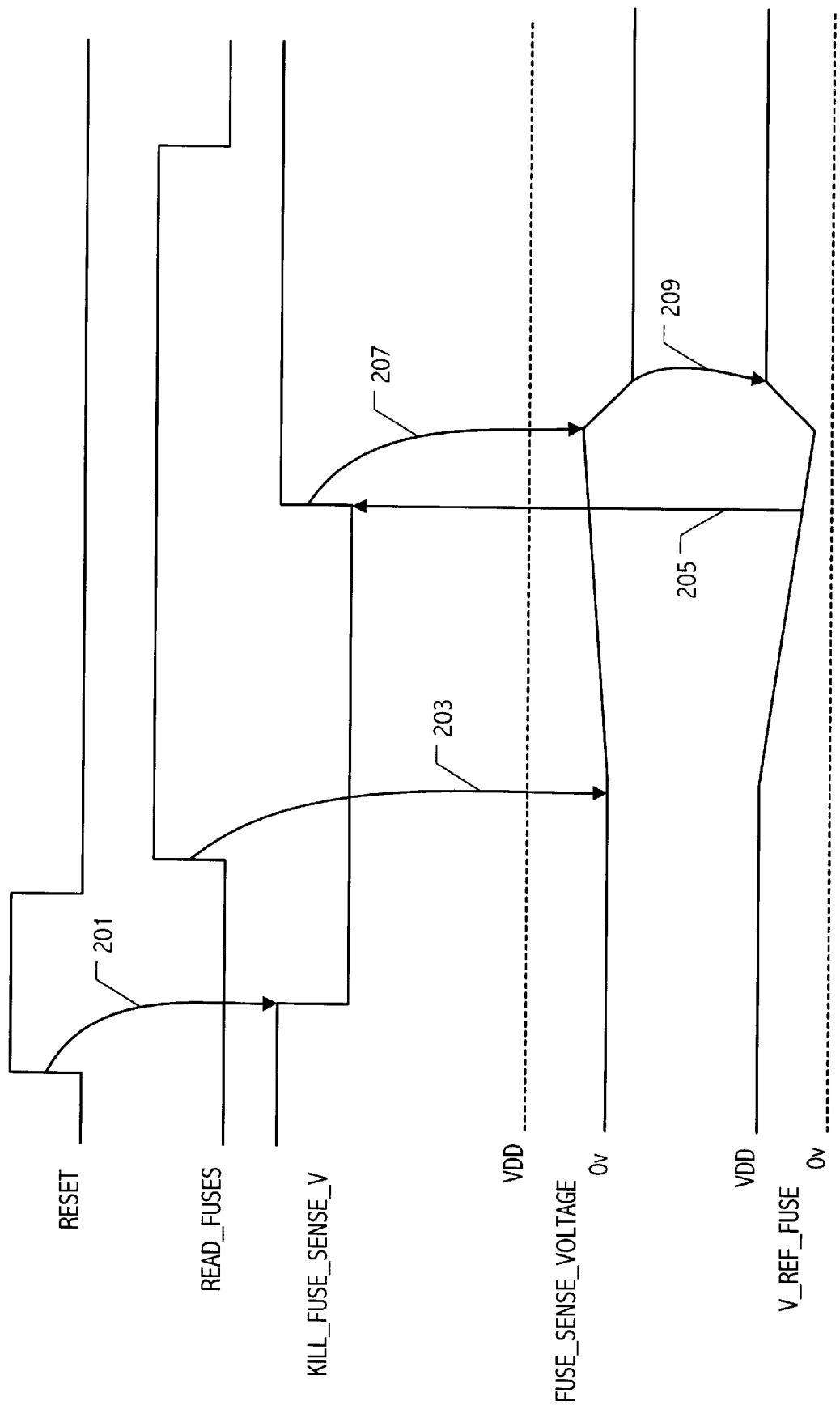
FIG. 2 shows waveforms illustrating operation of the circuit in FIG. 1.

Referring now to FIG. 1 and FIG. 2, the operation of the circuit shown in FIG. 1 is explained, with reference to the waveforms in FIG. 2. Sometime after chip power-up, the RESET signal on node 140 is asserted which clears all of the fuse storage cells and sets the signal KILL_FUSE_SENSE_V on node 135 to zero as shown at 201. Some time later (determined by external control logic) the signal READ supplied on node 137 asserts thereby indicating a request to read the fuses. In an alternative embodiment, node 140 is coupled to an inverted READ signal (supplied on node 137 and then inverted), such that the fuse sense circuits are reset when READ is not asserted. After READ asserts, the signal FUSE_SENSE_VOLTAGE on node 119 begins to rise as shown at 203. Note that the AND gate 137, which drives this signal is sized such that the rise time of FUSE_SENSE_VOLTAGE on node 119 will be relatively slow as shown in FIG. 2. The slow rise time is important for reasons detailed below. At some point in time FUSE_SENSE_VOLTAGE will have risen high enough such that the current 138 through the reference fuses 133 will cause the voltage on the signal V_REF_FUSE on node 139 to be low enough to turn on the P-channel transistor 141 (M5) which will flip the reference fuse storage cell 143 in the control circuit 103. That will cause the signal KILL_FUSE_SENSE_V on node 135 to assert as shown at 205 in FIG. 2, which will then cause FUSE_SENSE_VOLTAGE to go back to zero as shown at 207. That in turn causes V_REF_FUSE to go back to one as shown at 209 turning off pull-up transistor 141 (M5).

Note that FUSE_SENSE_VOLTAGE is not a full rail-signal. The number of reference fuses in the sense control circuit are chosen (based on their pre-programmed resistance) such that when V_REF_FUSE on node 139 is low enough to turn on transistor 141 (M5), FUSE_SENSE_VOLTAGE has not yet risen to full rail. Keeping the maximum amplitude of FUSE_SENSE_VOLTAGE less than full rail will help ensure that the N-channel sense transistors (113 (M1) in all of the fuse cells and 145 (M4) in the sense control circuit) stay in saturation during the fuse sensing process. This is the reason that the rise time on FUSE SENSE VOLTAGE needs to be slow. Note that in an embodiment a contact mask option may be utilized to reduce the width of the sense transistor in case the fuse resistance is higher than expected.

As stated above, keeping the FUSE_SENSE_VOLTAGE less than full rail helps ensure that the sense transistors stay in saturation. The saturation region is defined as Vds>Vgs−Vt, where Vds is the voltage between the drain and source; Vgs is the voltage between the gate and source; and Vt is the threshold voltage. When the sense transistors are "on" (i.e. when Vgs>Vt), there will be current flowing through the fuses. That will cause a voltage drop across the fuse which will lower the drain voltage (Vds) on the sense transistor. If that voltage drops below Vgs−Vt, then the transistor is no longer in saturation. So, as Vgs increases, the transistor will be closer to dropping out of saturation. When the sense transistor is on and current is flowing through the fuse there will be a voltage drop across the fuse. Since Vds will not be equal to the rail voltage, if Vgs ever rises all the way to rail, that indicates that the transistor is not in saturation.

The illustrated embodiment in FIG. 1 essentially measures the resistance of a fuse by comparing it to the reference resistance (in this case a series string of unprogrammed fuses). The circuit determines if the resistance of the fuse in question is either much less than (in which case the fuse in question is an unprogrammed fuse) or much greater than (in which case the fuse in question is a programmed fuse) the reference resistance. That may be accomplished by passing an "identical" current through the reference resistance and the fuse in question and then use the fuse sensing circuit to make this determination. The reason to keep the sense transistors in saturation is to try to keep the sense currents in all of the fuses identical. Actually in practice, the currents flowing through all of the fuses will never be identical due to several factors, but they should be very similar. In the saturation region, the current through the transistor will be, essentially, independent of Vds and is mostly controlled by device geometry. The fact that the current will be independent of Vds is key since the resistance of the fuse, which could vary over a wide range, will cause a wide range of voltages on the drain of the sense transistor. Therefore by careful selection of device geometry the sense currents through all of the fuses (nearly) will be kept nearly identical.

As outlined above, FUSE_SENSE_VOLTAGE on node 119 eventually rises high enough to flip the reference fuse storage cell 143, which causes KILL_FUSE_SENSE_V on node 135 to assert, which in turn causes FUSE_SENSE_VOLTAGE to go to zero. That feedback process takes a certain amount of time to occur due to circuit delays. If the rise time of FUSE_SENSE_VOLTAGE is very fast, it may overshoot in the time it takes the feedback process to occur. That could cause FUSE_SENSE_VOLTAGE to go higher than intended, which would cause the fuse sense current to be higher than intended which could cause an unprogrammed fuse to be incorrectly read as programmed.

As shown in FIG. 2, FUSE_SENSE_VOLTAGE is basically a ramp waveform that does not reach full rail voltage. That signal is fed to all of the sense transistors (113 (M1) in all of the fuse cells and 145 (M4) in the sense control circuit) and is used to control the current flowing through the fuse elements during the sensing operation. It is important to note that all of the sense transistors are matched. Since they are matched and the same control voltage feeds the gates of all these transistors then it follows that the sense current flowing through all of the fuse elements will match (assuming the resistances of all the fuses match). Keeping the sense currents matched allows the sense circuits to essentially measure the resistance of a fuse relative to the resistance of a number of reference fuses.

Figure 3:
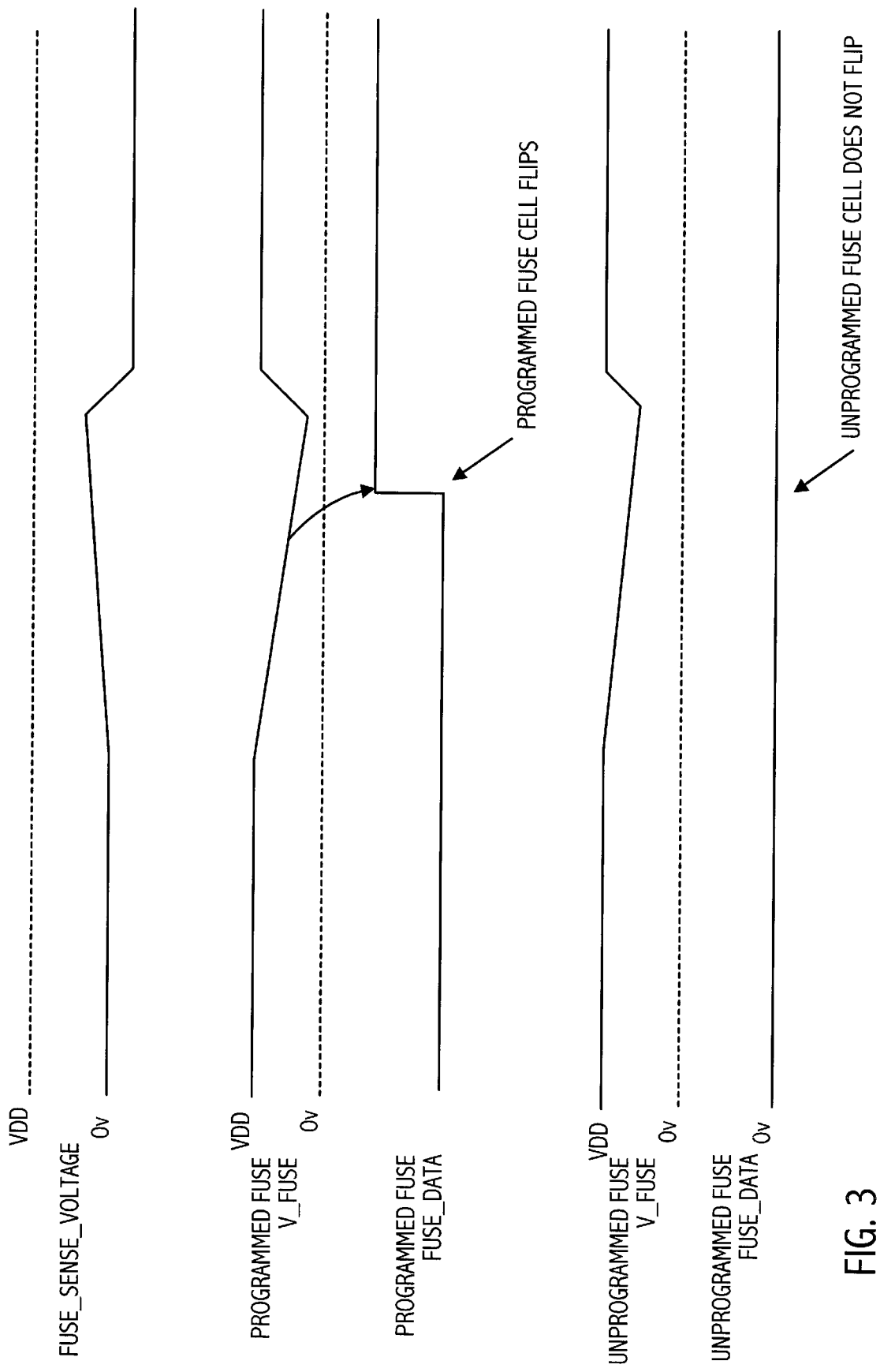
FIG. 3 illustrates waveforms associated with both a programmed and an unprogrammed fuse

FIG. 3 illustrates waveforms associated with reading the programming state of both a programmed and an unprogrammed fuse. For the case of the programmed fuse, the operation of the sense circuit is as follows. FUSE_SENSE_VOLTAGE rises to a point that is high enough to cause the sense transistor 113 (M1) to pull enough current through the fuse to cause the voltage at node 115 (V_FUSE) to drop low enough to turn on the pull-up transistor 109 (M2) which will cause the fuse storage cell 107 to flip. Note that this sensing scheme provides that the FUSE_SENSE_VOLTAGE signal will reach a voltage high enough to flip the fuse storage cell 107 of a programmed fuse as long as the post-program resistance of a fuse is greater than the total series resistance of the reference fuses 133. The fuse storage cell 107 will flip, thereby indicating that the fuse element is programmed, before FUSE_SENSE_VOLTAGE returns to zero as a result of fuse storage cell 143 flipping in control circuit 103.

For the case of an unprogrammed fuse, as shown in FIG. 3, the maximum amplitude of FUSE_SENSE_VOLTAGE will not be high enough to cause the voltage at node V_FUSE to drop low enough to turn on the pull-up transistor M2 so the fuse storage cell will not flip and the output signal FUSE_DATA will stay at zero. FUSE_SENSE_VOLTAGE returns to zero as a result of fuse storage cell 143 flipping in control circuit 103 before the gate voltage on transistor 109 (M2) is driven low enough to flip the storage cell 107.

Note that all of the fuse sense circuits, as well as the sense transistors and the fuse elements themselves need to be carefully matched. That is readily achieved with careful layout techniques. The resistance of all the initially unprogrammed fuse elements needs to be very tightly controlled. That can be controlled through the same process steps that control gate polysilicon used in all transistors, which is always very tightly controlled and well known in the art. In one embodiment, the unprogrammed fuses will be in the few 10's of Ohms range while the programmed resistances to be around 10–20 times the unprogrammed resistance. In general the unprogrammed resistance should be as low as practically possible while maintaining the ability to program the fuse where the programmed resistance is a high as possible. The specific resistance values will vary according to design goals and manufacturing technology.

The fuse elements are designed such that the post-program resistance is fairly high. The post/pre program resistance ratio should be significantly higher than the number of fuses used in the reference fuse stack 133 in order to assure that the circuit will always correctly sense a programmed fuse. The fuse elements should be designed such that the pre-program resistance is fairly low. The fuse pre-program resistance should be significantly lower than the resistance of the reference fuses in series in order to assure that the circuit will correctly sense an unprogrammed fuse.

It is desirable to be able to determine in a test environment if the pre and post program resistances of the fuses are within design tolerance. With many fuse sensing schemes this would require adding a substantial amount of test support circuitry. With the fuse sensing scheme described herein the capability to evaluate whether the programmed and/or unprogrammed fuse is within design tolerance is relatively simple and requires only a few more transistors to implement.

Figure 4:
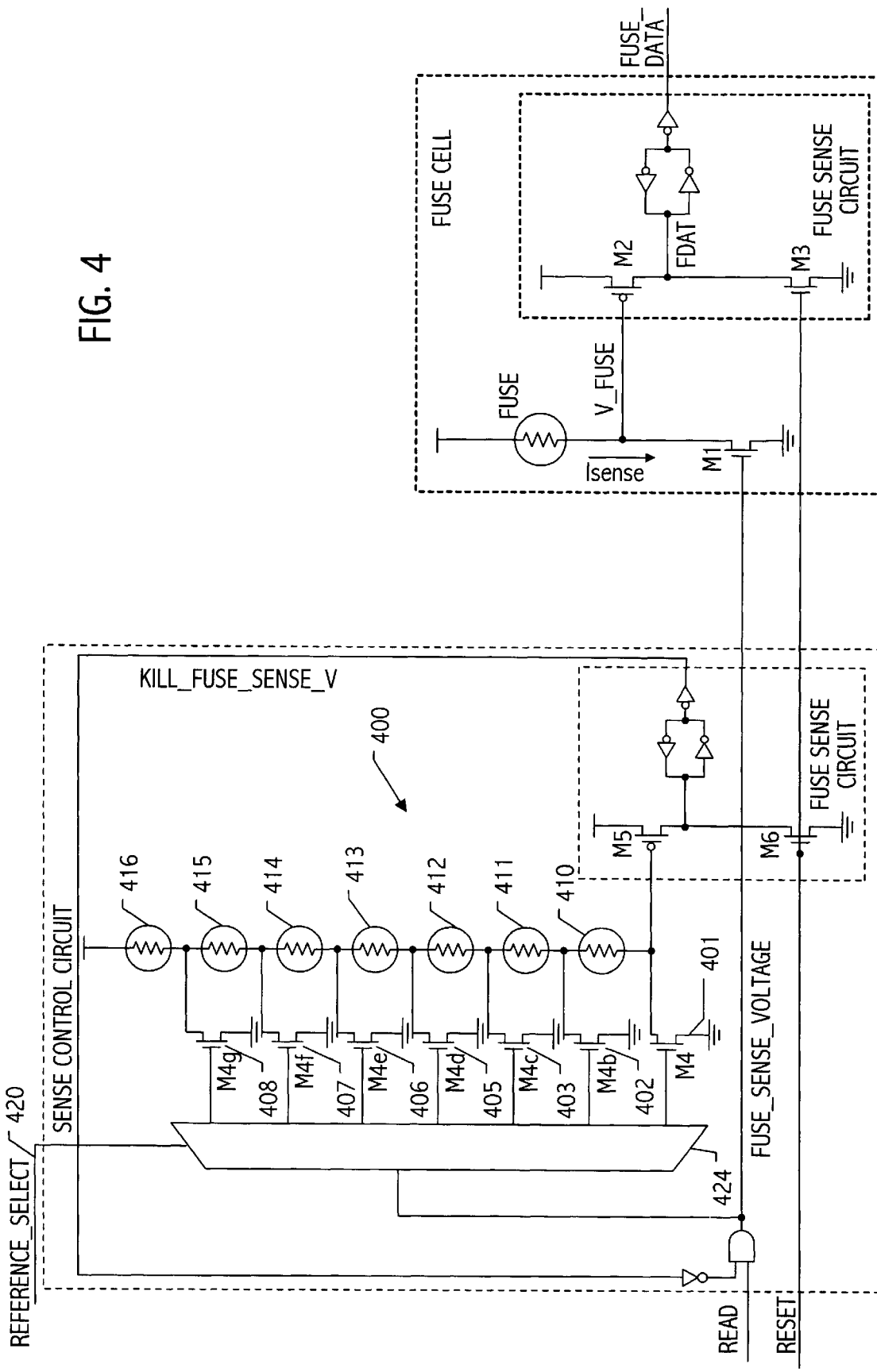
FIG. 4 illustrates an approach for determining in a test environment if the pre and post program resistances of the fuses are within design tolerance The use of the same reference symbols in different drawings indicates similar or identical items.

FIG. 4 illustrates that evaluation technique. In FIG. 4, the resistance of the reference stack 400 is varied using demultiplexer 401, reference sense transistors 402–408 and their associated unprogrammed fuse elements 410–416. The resistance of the reference fuse stack may be varied, typically in a test environment, by selectively coupling FUSE_SENSE_VOLTAGE on node 119 to one of the transistors 401–408 through demultiplexer 421 using control signals 420, thereby changing the number of unprogrammed fuse elements in series. By changing the number of reference fuses that the reference sense current is flowing through (essentially changing the resistance of the reference fuse stack) and then reading both programmed and unprogrammed fuse cells, a determination may be made of whether the programmed or unprogrammed fuse resistance is out of design tolerance. Note that as the number of reference fuses is reduced (as the demultiplexer selects a transistor in the direction of transistor 408), it becomes easier to sense a programmed fuse and harder to sense an unprogrammed fuse. A setting with fewer fuses in the current path may be used to evaluate (margin) unprogrammed fuses. When the demultiplexer selects a transistor in the direction of transistor 401 (a setting with more reference fuses in series) it is easier to sense an unprogrammed fuse and harder to sense a program fuse. Such a setting may be used to evaluate unprogrammed fuses. A default setting may use three fuses in series.

Thus a circuit has been described for sensing fuses that is simpler to implement and maintain than traditional sensing approaches involving complicated analog circuits. In addition, the fuse sense circuit described above takes up less area than traditional sensing approaches and ease easier to test in terms of fuse characterizations.

The embodiments described herein are intended to be illustrative and are not intended to limit the scope of the invention as set forth in the following claims. For example, while the fuse elements have been described as polysilicon, other suitable materials may be used. Other variations and modifications of the embodiments disclosed herein, may be made based on the description set forth herein, without departing from the scope of the invention as set forth in the following claims.

What is claimed is:

1. An integrated circuit comprising:
   at least one fuse cell circuit including a first fuse and a first fuse sense circuit coupled to sense a programming state of the first fuse and supply an indication thereof;
   a sense control circuit including a plurality of reference fuses, and a second fuse sense circuit coupled to the reference fuses, the sense control circuit being coupled to supply a sense control signal to the fuse cell circuit to cause the fuse cell circuit to sense the programming state of the first fuse when the sense control signal is asserted, the sense control signal being asserted for a time period determined, at least in part, by a resistance value of the reference fuses.

2. The integrated circuit as recited in claim 1 wherein the second fuse sense circuit in the sense control circuit is coupled to sense a voltage associated with the reference fuses when the sense control signal is asserted.

3. The integrated circuit as recited in claim 2 wherein the sense control circuit is coupled to receive a read fuse signal and wherein the sense control circuit logically combines the read fuse signal and a signal coupled to a storage cell in the second sense fuse circuit, storing an indication of the voltage associated with the reference fuses.

4. The integrated circuit as recited in claim 1 wherein the sense control signal rise time is slow and stays below a rail voltage.

5. The integrated circuit as recited in claim 1 where the first fuse cell circuit comprises a first sense transistor (M1) coupled to the first fuse, the sense control signal being coupled to a gate of the first sense transistor and coupled to cause a current to flow through the first fuse when the sense control signal is asserted, the current through the first fuse being determined, at least in part, according to the programming of the first fuse.

6. The integrated circuit as recited in claim 5 wherein the first fuse sense circuit comprises:
   a second transistor (M2) coupled to a first supply voltage, a gate of the second transistor being coupled to the fuse and the first sense transistor;
   a third transistor (M3) coupled to a second supply voltage, and the second transistor;
   a fuse storage cell coupled to the second and third transistors to store a sensed value of the fuse;
   wherein the third transistor is coupled to cause the fuse storage cell to store a predetermined value when a reset signal coupled to a gate of the third transistor is asserted; and
   wherein the second transistor is coupled to cause the fuse storage cell to store a value indicative of the programming state of the first fuse, when the sense control signal is asserted.

7. The integrated circuit as recited in claim 1 where the fuse control circuit includes a reference sense transistor (M4) coupled to the reference fuses, the sense control signal being coupled to a gate of the reference sense transistor, the reference sense transistor being coupled to cause a current to flow through the reference fuses when the sense control signal is asserted, the current through the reference fuses being determined, at least in part, according to a resistance value of the reference fuses.

8. The integrated circuit as recited in claim 7 wherein the second fuse sense circuit comprises:

a pull-up transistor (M5) coupled to a first supply voltage, a gate of the pull-up transistor being coupled to the reference fuses and the reference sense transistor;

a pull-down transistor (M6) coupled to a second supply voltage, and the pull-up transistor;

a fuse storage cell coupled to the pull-up and pull-down transistors to store a sensed value of the reference fuses;

wherein the pull-down transistor is coupled to cause the fuse storage cell to store a predetermined value when a reset signal coupled to a gate of the pull-down transistor is asserted; and wherein the pull-up transistor is coupled to cause the fuse storage cell to store a value indicative of a voltage level present on a gate of the pull-up transistor when the sense control signal is asserted, the voltage level being determined at least in part by the resistance value of the reference fuses.

9. The integrated circuit as recited in claim 8 wherein the resistance of the reference fuses is such that when the pull-up transistor turns on, the sense control signal has not yet risen to full rail.

10. The integrated circuit as recited in claim 1 wherein the reference fuses are unprogrammed and coupled serially and a resistance value of a current path through the serially coupled reference fuses is higher than a resistance value of the first fuse when the first fuse is unprogrammed.

11. The integrated circuit as recited in claim 1 wherein resistance value of the first fuse when programmed is larger than a resistance value of a current path through the serially coupled reference fuses.

12. The integrated circuit as recited in claim 1 wherein a ratio between a programmed resistance value and a preprogrammed resistance value of the first fuse is significantly higher than a number of serially connected reference fuses forming a current path.

13. The integrated circuit as recited in claim 1 wherein a preprogrammed resistance of the first fuse is lower than a resistance of a current path formed by the reference fuses in series.

14. The integrated circuit as recited in claim 1 further comprising a resistance varying circuit coupled to vary a resistance value of a current path of the reference fuses according to one or more control signals.

15. The integrated circuit as recited in claim 14 wherein the resistance varying circuit includes a demultiplexer circuit coupled to selectively couple the sense control signal to one of a plurality of reference sense transistors, each of the reference sense transistors coupled between a first supply voltage and at least one reference fuse, and wherein the resistance is determined according to which of the plurality of reference sense transistors is coupled to the sense control signal.

16. A method for determining a programming state of one or more fuses comprising:

receiving a read fuse request in a sense control circuit;

generating an asserted sense control signal in response to the read fuse request;

causing a current to flow through a reference resistance in response to the asserted sense control signal; and causing the sense control signal to deassert according to a voltage level present at one end of the reference resistance when the current flows through the reference resistance.

17. The method as recited in claim 16 wherein causing the sense control signal to deassert further comprises:

causing a control storage cell to change values in response to the voltage level present at the one end of the reference resistance; and logically combining a signal coupled to an output of the control storage cell and the read fuse request thereby deasserting the sense control signal.

18. The method as recited in claim 17 wherein the sense control signal is a ramp signal not reaching full rail voltage before the control storage cell changes value in response to the voltage level present at the one end of the reference resistance.

19. The method as recited in claim 17 wherein causing the storage cell to change values further comprises coupling a supply voltage to the storage cell through a transistor having a gate coupled to the voltage level present at the one end of the reference resistance.

20. The method as recited in claim 16 further comprising supplying the sense control signal to at least one fuse cell including a fuse and a sensing circuit, to cause a sense current to flow the fuse, a voltage generated at a first end of the fuse being sensed to determine the programming state of the fuse.

21. The method as recited in claim 20 further comprising:

supplying the sense control signal to a gate of a first sense transistor in a first fuse cell indicating that the programming state of the fuse should be sensed, a second end of the fuse being coupled to a first supply voltage and the first end being coupled to the first sense transistor;

generating the sense current through the fuse and the first sense transistor according to a value of the sense control signal and a resistance value of the fuse;

causing a gate voltage to appear on a gate of a second transistor coupled between the fuse and the first sense transistor, the gate voltage being sufficient to cause a storage cell coupled to the second transistor to change values when the fuse has been programmed and not sufficient to cause the storage cell to change values when the fuse has not been programmed.

22. The method as recited in claim 21 wherein the control storage cell changes values after the storage cell in the fuse cell changes values when the fuse is programmed.

23. The method as recited in claim 20 wherein the reference resistance is formed of multiple serially connected fuses.

24. The method as recited in claim 20 wherein a resistance value of the fuse when programmed is larger than the reference resistance.

25. The method as recited in claim 20 wherein a ratio between a programmed resistance value and a preprogrammed resistance value of the fuse is significantly higher than a number of serially connected reference fuses forming the reference resistance.

26. The method as recited in claim 20 wherein a preprogrammed resistance of the fuse is lower than the resistance of a current path formed by the reference fuses in series.

27. The method as recited in claim 16 further comprising varying the reference resistance according to one or more control signals.

28. The method as recited in claim 27 wherein varying the reference resistance further comprises:

selectively coupling the sense control signal to one of a plurality of reference sense transistors, each of the reference sense transistors coupled between a first supply voltage and at least one reference fuse; and selecting a resistance value of the reference resistance according to which of the plurality of reference sense transistors is coupled to the sense control signal.

29. An integrated circuit comprising:

means for sensing a fuse state according to a sense control signal and supplying an indication thereof; and means for sensing a reference resistance and changing a value of the sense control signal in response thereto.

30. The integrated circuit as recited in claim 29 further comprising means for varying the reference resistance.

* * * * *